(12) United States Patent
Suenaga (10) Patent No.: US 6,633,365 B2
(45) Date of Patent: Oct. 14, 2003

(54) PROJECTION OPTICAL SYSTEM AND EXPOSURE APPARATUS HAVING THE PROJECTION OPTICAL SYSTEM

(75) Inventor: Yutaka Suenaga, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/006,667

(22) Filed: Dec. 10, 2001

(65) Prior Publication Data

US 2003/0030916 A1 Feb. 13, 2003

(30) Foreign Application Priority Data

Dec. 11, 2000 (JP) ........................... 2000-375992

(51) Int. Cl.$^7$ ............... G03B 27/42; G03B 27/54
(52) U.S. Cl. ............................. 355/53; 355/67
(58) Field of Search ..................... 355/53, 67, 30

(56) References Cited

U.S. PATENT DOCUMENTS

| | | | | |
|---|---|---|---|---|
| 5,781,278 A | * | 7/1998 | Matsuzawa et al. | 355/53 |
| 5,856,884 A | * | 1/1999 | Mercado | 359/649 |
| 5,973,764 A | * | 10/1999 | McCullough et al. | 355/30 |
| 6,252,662 B1 | * | 6/2001 | Sugita | 356/399 |
| 6,259,508 B1 | | 7/2001 | Shigematsu | |
| 6,459,534 B1 | * | 10/2002 | Kato et al. | 359/649 |

* cited by examiner

*Primary Examiner*—Russell Adams
*Assistant Examiner*—D. Ben Esplin
(74) *Attorney, Agent, or Firm*—Oliff & Berridge, PLC (57) ABSTRACT

A projection optical system according to the present invention whose image side numerical aperture is greater than or equal to 0.75, and which forms an image of a first object upon a second object using light of a predetermined wavelength less than or equal to 300 nm, comprises: a first lens group G1 of positive refractive power; a second lens group G2 of negative refractive power; a third lens group G3 of positive refractive power; and a fourth lens group G4 of positive refractive power, and: the first lens group G1, the second lens group G2, the third lens group G3 and the fourth lens group G4 are arranged in order from a side of the first object; and a distance D in mm along an optical axis between an optical surface of the fourth lens group G4 closest to the second object, and the second object, satisfies a condition of $0.1 < D < 5$.

11 Claims, 9 Drawing Sheets

PROJECTION OPTICAL SYSTEM AND EXPOSURE APPARATUS HAVING THE PROJECTION OPTICAL SYSTEM

INCORPORATION BY REFERENCE

The disclosure of the following priority application is herein incorporated by reference:

Japanese Patent Application No. 2000-375992 filed Dec. 11, 2000.

BACKGROUND OF THE INVENTION

1. Field of the Invention

The present invention relates to a projection optical system and to an exposure apparatus to which such a projection optical system is fitted, and more particularly relates to a projection optical system which is suitable for an exposure apparatus which is used for the manufacture of semiconductor elements or liquid crystal display elements and the like by a process of photolithography.

2. Description of the Related Art

In a photolithography process for manufacture of semiconductor elements or the like, there is employed an exposure apparatus for projecting and exposing an image of a pattern upon a mask via a projection optical system onto a photosensitive substrate such as a wafer with this type of exposure apparatus, the resolving power which is required from the projection optical system is increasing along with increase of the degree of integration of the semiconductor elements or the like. Due to this, along with shortening the wavelength of the illumination light (the exposure light), a compelling necessity is experienced for raising the image side numerical aperture (NA) of the projection optical system to the ultimate limit, in order to satisfy this requirement for resolving power of the projection optical system.

However, when the numerical aperture of the projection optical system is increased, the lens outer diameter is increased in proportion to the size of the numerical aperture. As a result, the outer diameter (the glass material diameter) of the block of optical material from which this lens is manufactured also becomes great, and it becomes difficult to obtain an optical material block of the required homogeneity, and therefore it is hard to manufacture an optical system of good performance. Furthermore, when the lens outer diameter becomes great, the lens can easily be influenced by bending or distortion due to its weight, which also makes it difficult to manufacture an optical system of good performance.

SUMMARY OF THE INVENTION

The objective of the present invention is to provide a high resolution projection optical system, and an exposure apparatus to which such a projection optical system is fitted, which are capable of ensuring a large image side numerical aperture, while restraining increase in the size of the lens outer diameter. Furthermore, it is another objective of the present invention to provide a method of microdevice manufacture, which can manufacture a good quality microdevice at high accuracy by utilizing an exposure apparatus according to the present invention as defined above, to which is fitted a high resolution projection optical system which has a large image side numerical aperture.

A projection optical system according to the present invention whose image side numerical aperture is greater than or equal to 0.75, and which forms an image of a first object upon a second object using light of a predetermined wavelength less than or equal to 300 nm, comprises: a first lens group G1 of positive refractive power; a second lens group G2 of negative refractive power; a third lens group G3 of positive refractive power; and a fourth lens group G4 of positive refractive power, and: the first lens group G1, the second lens group G2, the third lens group G3 and the fourth lens group G4 are arranged in order from a side of the first object; and a distance D in mm along an optical axis between an optical surface of the fourth lens group G4 closest to the second object, and the second object, satisfies a condition of $0.1<D<5$.

In this projection optical system, it is preferred that the projection optical system has an image side numerical aperture greater than or equal to 0.8.

Also, it is preferred that with T being a sum of thicknesses along the optical axis of all optical members included in the fourth lens group G4, and with D being the distance along the optical axis between the optical surface of the fourth lens group G4 closest to the second object, and the second object, a condition of $0.001<D/T<0.2$ is satisfied.

Also, it is preferred that with T being a sum of the thicknesses along the optical axis of all optical members included in the fourth lens group G4, and with L being a distance along the optical axis between the first object and the second object, a condition of $0.02<T/L$ is satisfied.

Also, it is preferred that a distance L in mm along the optical axis between the first object and the second object satisfies a condition of $800<L<1600$.

Also, it is preferred that a focal length F2 of the second lens group G2 and a distance L in mm along the optical axis between the first object and the second object satisfy a condition of $0.01<|F2|/L<0.15$.

Also, it is preferred that at least one of a plurality of optical surfaces comprised in the projection optical system is formed in an aspherical shape.

An exposure apparatus according to the present invention, comprises: an illumination system for illuminating a mask as a first object; a projection optical system described above that forms an image of a pattern which is formed upon the mask upon a photosensitive substrate as the second object; and a prevention device that prevents gas which is generated from the photosensitive substrate from adhering to the optical surface closest to the second object of the fourth lens group G4 of the projection optical system.

In this exposure apparatus, it is preferred that the prevention device comprises a flow forming device that forms a predetermined flow of gas or liquid in a optical path between the optical surface closest to the second object of the fourth lens group G4 and the photosensitive substrate.

An exposure method according to the present invention, comprises: an illumination process of illuminating a mask as a first object; and an exposure process of exposing, via a projection optical system described above, an image of a pattern which is formed upon the mask upon a photosensitive substrate as the second object, and the exposure process comprises a flow formation process of forming a predetermined flow of gas or liquid in a optical path between the optical surface closest to the second object of the fourth lens group G4 and the photosensitive substrate, in order to prevent gas which is generated from the photosensitive substrate from adhering to the optical surface closest to the second object of the fourth lens group G4.

A method according to the present invention for manufacturing a microdevice, comprises: an exposure process of exposing a pattern on a mask upon a photosensitive substrate, using an exposure method described above; and a development process of developing the photosensitive substrate which has been exposed by the exposure process.

DESCRIPTION OF THE PREFERRED EMBODIMENTS

Generally, with a projection optical system which is fitted to an exposure apparatus, when the image side numerical aperture is increased with the distance between the lens surface which is closest to the image side (the wafer side) and the wafer, in other words the working distance, being kept constant, the lens outer diameter also becomes greater in proportion to the increase of the image side numerical aperture. One reason for this is that generation of negative high order spherical aberration is promoted. This point will now be explained.

It often happens that the lens surface of a projection optical system which is closest to the image side is formed in a shape which has small curvature and is close to a plane. In this case, when light is emitted from the projection optical system towards the wafer with a large numerical aperture, it experiences a large refraction effect at this lens surface which is closest to the image side which is formed in a shape close to a plane, and accordingly is subjected to high order spherical aberration. Here, the amount of high order spherical aberration which is generated is nearly proportional to the above described working distance D. Accordingly, if the working distance D is set to be small, it is possible to suppress the generation of high order spherical aberration to a low level, and it is possible to restrain the lens outer diameter to be comparatively small, even if the image side numerical aperture is made large.

Thus, in the present invention, the working distance D is set within a relatively small predetermined range according to the following condition (1), with a basic construction which comprises, in order from the object side (the mask side): a first lens group G1 of positive refractive power; a second lens group G2 of negative refractive power; a third lens group of positive refractive power; and a fourth lens group G4 also of positive refractive power. As a result, with the present invention, it is possible to ensure a large image side numerical aperture along with restraining increase in the size of the lens outer diameter. In the following, the structure of the present invention will be described in more detail with reference to various conditions appertaining thereto.

With the present invention, the working distance D (units mm) along the optical axis between the optical surface of the fourth lens group G4 which is closest to the second object (which is closest to the image side: which in the case of an exposure apparatus is the extreme optical surface in the direction of the wafer) and the second object (which in the case of an exposure apparatus is the wafer) should satisfy the following condition (1):

$$0.1 < D < 5 \tag{1}$$

When the working distance D exceeds the upper limit value of the above condition (1), the working distance D becomes too large, and the incidence of high order spherical aberration becomes great, so that a requirement arises to correct this high order spherical aberration in advance with a lens which is positioned more to the object side than the lens which is closest to the image side. As a result the structure of the optical system becomes complicated and the lens outer diameter becomes large, and it becomes difficult to implement an optical system of a realistic size.

On the other hand, when the working distance D drops below the lower limit value of the above condition (1), the working distance D becomes too small, and the operability and so on of the optical system is remarkable deteriorated. In particular, in the case of an exposure apparatus, it becomes difficult to prevent gas generated due to irradiation from the resist which is coated upon the wafer (in the following this phenomenon is termed "out-gassing") from adhering to the surface of the lens which is closest to the image side. Furthermore, along with it becoming difficult to perform autofocusing upon the wafer surface, the danger of contacting the wafer against the projection optical system when changing the wafer becomes very high.

Further, with the present invention, it is desirable for the following condition (2) to be satisfied:

$$0.001 < D/T < 0.2 \tag{2}$$

Here T is the sum of the thicknesses along the optical axis of all the optical members which make up the fourth lens group G4, in other words, the total lens thickness of the fourth lens group G4. Furthermore, as described above, D is the working distance.

When the upper limit value of the above condition (2) is exceeded, just as in the above case when the upper limit value of the condition (1) is exceeded, the working distance D becomes too large, and the incidence of high order spherical aberration becomes great, so that the structure of the optical system becomes complicated and the lens outer diameter becomes undesirable large. On the other hand, when the lower limit value of the above condition (2) is dropped below, just as in the above case when the lower limit value of the above condition (1) is dropped below, the working distance D becomes too small, and, along with it becoming difficult to prevent adherence of outgassed material (maybe called as just outgas) and to perform autofocusing upon the wafer surface, an undesirable high danger arises of contacting the wafer against the projection optical system when changing the wafer.

Further, with the present invention, it is desirable for the following condition (3) to be satisfied:

$$0.02 < T/L \tag{3}$$

Here L is the distance along the optical axis from the first object (in the case of an exposure apparatus, the mask) to the second object, in other words the distance between the objective and the image. Furthermore, as described above, T is the total lens thickness of the fourth lens group G4.

This condition (3) is a condition for proper correction for spherical aberration and coma aberration. In more detail, if the total lens thickness T of the fourth lens group G4 is sufficiently great, the generation of spherical aberration and coma aberration becomes small, and the corresponding correction is easy. However, if the lower limit value of condition (3) is dropped below, the total lens thickness T of the fourth lens group G4 has become too small, and, with the constant positive refractive power being kept the same, problems arise in properly correcting the spherical aberration and the coma aberration, and an undesirable deterioration takes place in the focusing performance.

Further, with the present invention, it is desirable for the distance L (units mm) between the objective and the image point of the projection optical system to satisfy the following condition (4):

$$800 < L < 1600 \tag{4}$$

Condition (4) is a condition for proper correction of total aberration while maintaining a wide projection field of view (in the case of an exposure apparatus, a wide exposure area). If the upper limit of condition (4) is exceeded, then the distance L between the object and the image points becomes too great, and this is undesirable because the size of the optical system is increased. In particular, in the case of application to an exposure apparatus, the optical system becomes too high, and this is undesirable, because it cannot then be conveniently employed as a component of an exposure apparatus. On the other hand, if the lower limit of condition (4) is dropped below, then difficulties arise with proper correction for coma aberration, and as a result this leads to an undesirable deterioration of focusing performance.

Now, although the generation of high order spherical aberration is kept low if the above described conditions (1) and (2) are satisfied, the amount thereof which is generated cannot be kept completely to zero. Accordingly, with the present invention, it is desirable to form at least one of the plurality of optical surfaces which make up the optical system in an aspherical shape, in other words to introduce an aspherical lens surface into the optical system; and thereby it is possible almost completely to correct high order spherical aberration.

Further, with the present invention, it is desirable for the following condition (5) to be satisfied:

$$0.01 < |F2|/L < 0.15 \tag{5}$$

Here, F2 is the focal length of the second lens group G2. Furthermore, as described above, L is the distance between the objective and the image.

This condition (5) is a condition relating to correction of Petzval sum in order to obtain flatness of the image plane. If the upper limit value for this condition (5) is exceeded, correction of Petzval sum becomes insufficient, and the flatness of the image plane is lost, which is undesirable. On the other hand, if the lower limit value for this condition (5) is dropped below, a remarkable amount of positive spherical aberration is generated, and it becomes difficult to correct this aberration even by using an aspherical surface as described above, so that this leads to a deterioration of focusing performance, which is undesirable.

It should be understood that, as described above, if the working distance D for this exposure apparatus is comparatively small, material which is outgassed from the resist can easily become adhered to the extreme lens surface towards the image side. As a result, the transparency of the extreme lens towards the image side is deteriorated, and along with this the optical performance of the projection optical system becomes worse. To combat this, with the present invention, it is desirable to prevent adherence of outgassed material to this optical surface by providing a predetermined flow of gas or liquid in the optical path between the optical surface closest to the image side of the fourth lens group G4, and the wafer.

Figure 1:
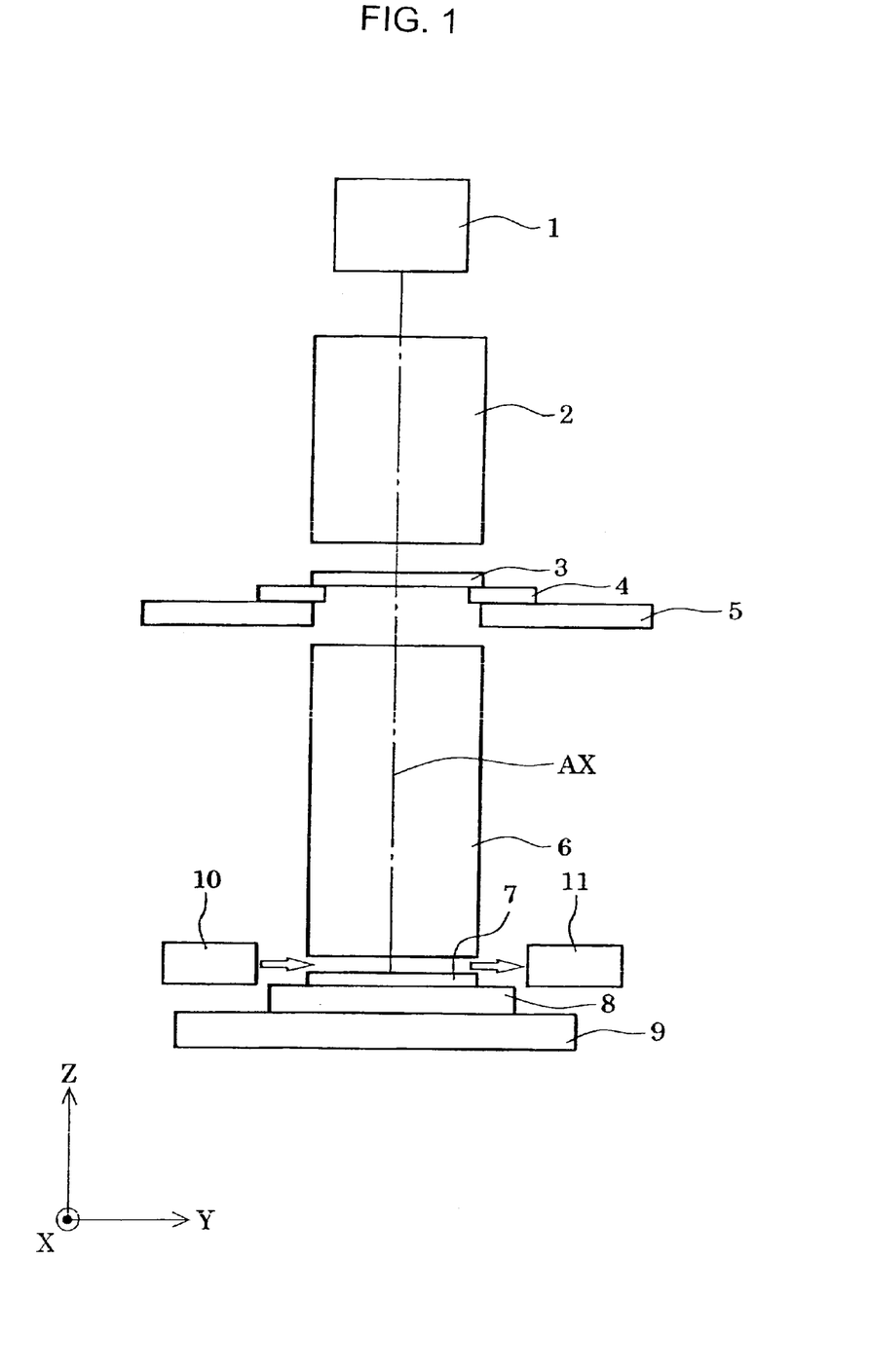
FIG. 1 is a figure schematically showing the structure of an exposure apparatus equipped with a projection optical system which is a preferred embodiment of the present invention.

The preferred embodiments of the present invention will now be explained with reference to the appended drawings. FIG. 1 is a figure schematically showing the structure of an exposure apparatus equipped with a projection optical system 6 which is a preferred embodiment of the present invention. It should be understood that, in FIG. 1, the Z-axis is set as parallel to the optical axis AX of the projection optical system 6, the Y-axis is set as parallel to the plane of the drawing paper of FIG. 1 in the plane perpendicular to the optical axis AX, and the X-axis is set as perpendicular to the plane of the drawing paper.

The exposure apparatus shown in the drawing comprises a KrF excimer laser light source 1 (which generates light of a central wavelength of 248.40 nm) which serves as a light source for supplying illumination light. The light which is emitted from the light source 1 illuminates, via an illumination optical system 2, a mask (reticle) 3 upon which a predetermined pattern is formed. The mask 3 is maintained parallel to the X-Y plane upon a mask stage 5 by a mask holder 4. Furthermore, the mask stage 5 is made to be shiftable in the mask plane (in other words the X-Y plane) and position controlled by the action of a drive system which has been omitted from the drawing, and its positional coordinates are measured by mask interferometers (not shown in the drawing either).

Light from the pattern which is formed upon the mask 3 forms, via the projection optical system 6, a mask pattern image upon a wafer 7 which is a photosensitive substrate. This wafer 7 is maintained parallel to the X-Y plane upon a wafer stage 9 by a wafer table (wafer holder) 8. Furthermore, the wafer stage 9 is made to be shiftable in the wafer plane (in other words the X-Y plane) and position controlled by the action of a drive system which has been omitted from the drawing, and its positional coordinates are measured by wafer interferometers (not shown in the drawing either). In this manner, the pattern upon the mask 3 is successively exposed upon each exposure region of the wafer 7 by performing a single exposure or by performing scanning exposure while drive controlling the wafer 7 two dimensionally in the X-Y plane which is perpendicular to the optical axis AX of the 5 projection optical system 6.

Furthermore, with this exposure apparatus, a supply section 10 is provided for supplying gas or liquid, so as to create a predetermined flow of gas or liquid in the narrow optical path between the projection optical system 6 and the wafer 7. In other words, this supply section 10 constitutes a prevention means for preventing adherence of outgassed material from the resist which is coated upon the wafer 7 upon the lens surface in the projection optical system 6 which is closest to the wafer side. It should be understood that, if the supply section 10 supplies a gaseous substance such as air, it is desirable to provide a suction section 11 for sucking away the air including the outgassed material, in order reliably to keep the outgassed material away from the optical path.

Moreover, in each of the preferred embodiments which will be described hereinafter, the projection optical system according to the present invention comprises, in order from the mask side, a first lens group G1 which has a positive refractive power, a second lens group G2 which has a negative refractive power, a third lens group G3 which has a positive refractive power, and a fourth lens group G4 which has a positive refractive power. Furthermore, in each of the preferred embodiments, for all of the optical members which constitute the projection optical system 6, there is used a quartz glass which has a refractive index of 1.50839 at the central wavelength of 248.40 nm.

Furthermore, in each of the preferred embodiments of the present invention, the aspherical surface is defined in the following Equation (a), where y is the height in the direction perpendicular to the optical axis, z is the distance (the sag amount) along the optical axis from the plane which contacts the summit of the aspherical surface to the position upon the aspherical surface which has the height y, r is the radius of curvature at the summit (the standard radius of curvature), k is the constant of the cone, and Cn is the aspherical coefficient of the nth order. It should be noted that, in each of the preferred embodiments, an asterisk is appended to the right of the surface number of each lens surface which is formed in an aspherical shape.

$$z = (y^2/r)/[1 + \{1-(1+k)\cdot y^2/r^2\}^{1/2}] + \\ C_4 \cdot y^4 + C_6 \cdot y^6 + C_8 \cdot y^8 + C_{10} \cdot y^{10} + C_{12} \cdot y^{12} + \\ C_{14} \cdot y^{14} + C_{16} \cdot y^{16} + C_{18} \cdot y^{18} \quad (a)$$

EMBODIMENT ONE

Figure 2:
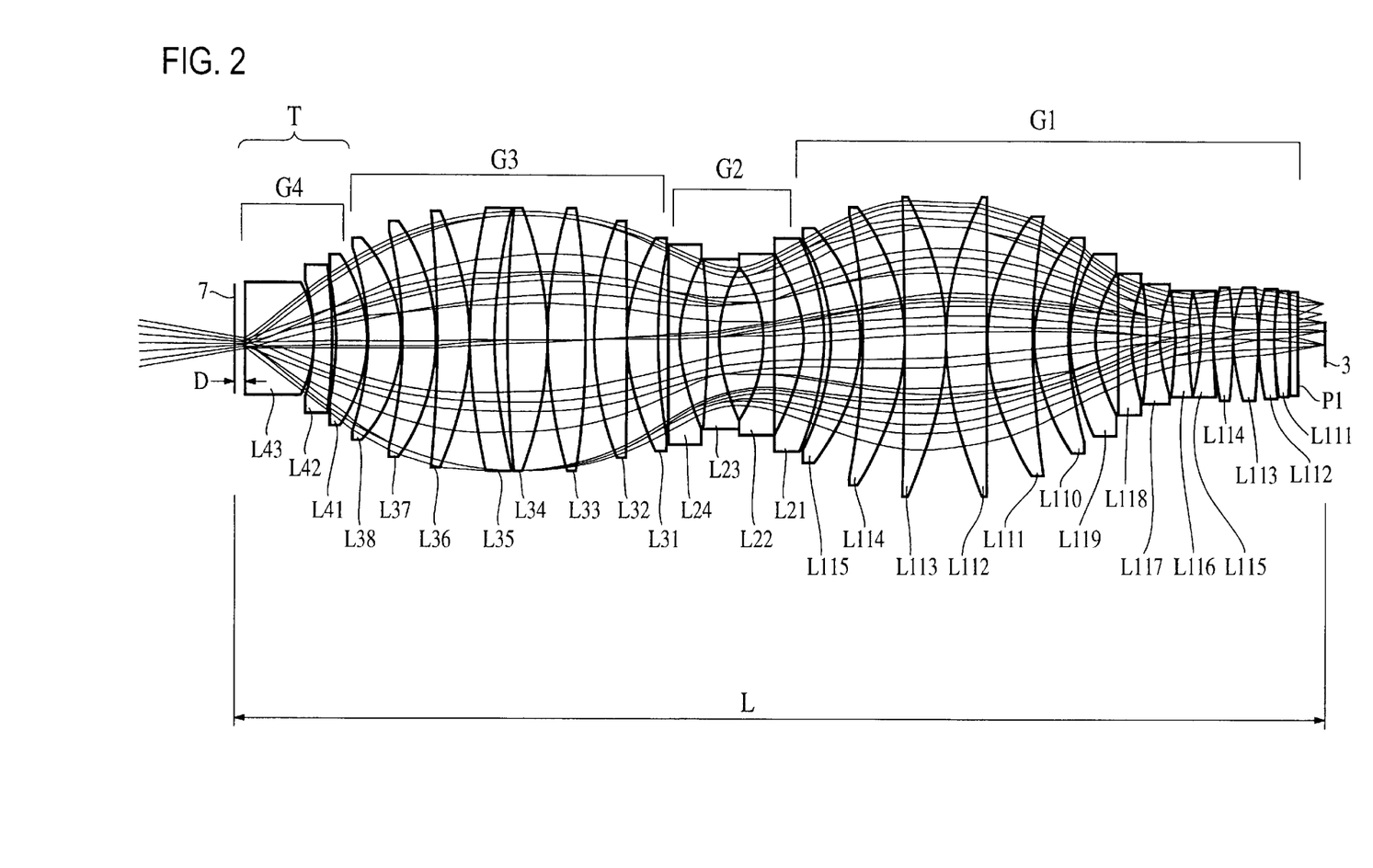
FIG. 2 is a figure showing the structure of lenses of a projection optical system according to a first preferred embodiment of the present invention.

FIG. 2 is a figure showing the structure of lenses of a projection optical system according to the first preferred embodiment of the present invention. In the lenses of FIG. 2, a first lens group G1 comprises, in order from the mask side: a parallel plane plate P1; a positive meniscus lens L11 which presents its concave surface to the mask side; a positive meniscus lens L12 which presents its concave surface to the mask side; a biconvex lens L13; another biconvex lens L14; a biconcave lens L15; another biconcave lens L16; another biconcave lens L17; a biconcave lens L18 whose surface on the mask side is formed in an aspherical shape; a negative meniscus lens L19 which presents its concave surface to the mask side; a positive meniscus lens L110 which presents its concave surface which is formed in an aspherical shape to the mask side; a positive meniscus lens L111 which presents its concave surface to the mask side; another positive meniscus lens L112 which presents its concave surface to the mask side; a positive meniscus lens L113 which presents its convex surface to the mask side; another positive meniscus lens L114 which presents its convex surface to the mask side; and yet another positive meniscus lens L115 which presents its convex surface to the mask side.

Furthermore, a second lens group G2 comprises, in order from the mask side: a negative meniscus lens L21 which presents its concave surface which is formed in an aspherical shape to the wafer side; a biconcave lens L22 of which both the surface towards the mask side and the surface towards the wafer side are formed in an aspherical shape; another biconcave lens L23 of which the surface towards the mask side is formed in an aspherical shape; and a negative meniscus lens L24 which presents its convex surface which is formed in an aspherical shape to the wafer side.

Yet further, a third lens group G3 comprises, in order from the mask side: a positive meniscus lens L31 which presents its concave surface to the mask side; another positive meniscus lens L32 which presents its concave surface to the mask side; a biconvex lens L33 of which the surface towards the mask side is formed in an aspherical shape; another biconvex lens L34; a negative meniscus lens L35 which presents its concave surface to the mask side; a positive meniscus lens L36 which presents its convex surface to the mask side; another positive meniscus lens L37 which presents its convex surface to the mask side; and yet another positive meniscus lens L38 which presents its convex surface to the mask side.

Moreover, a fourth lens group G4 comprises, in order from the mask side: a positive meniscus lens L41 which presents its convex surface to the mask side; a negative meniscus lens L42 which presents its convex surface to the mask side; and a positive meniscus lens L43 which presents its convex surface to the mask side. In this first preferred embodiment of the present invention, the supply section 1 is made so as to supply water (which has an index of refraction of 1.38 at the central wavelength of 248.40 nm), and it directs a flow of water so as to fill the narrow optical path between the projection optical system 6 and the wafer 7. In other words, the projection optical system 6 of this first preferred embodiment of the present invention is made as a water immersion type optical system.

The following Table 1 specifies all the data or parameters of the projection optical system according to this first preferred embodiment of the present invention. In the main data of Table 1, λ is the central wavelength of the exposure light, β is the projection magnification, Ym is the maximum image height, NA is the image side numerical aperture, and D is the working distance. Furthermore, Table 1 shows all the optical members in order from the wafer side, and in this table: the surface number in the first column is the sequential order of the surface from the wafer side; r in the second column is the radius of curvature of each surface in mm (in the case of an aspherical surface, this is the radius of curvature of the summit); d in the third column is the gap in mm along the optical axis between the surfaces, in other words the interval between the surfaces; and n in the fourth column is the index of refraction at the central wavelength λ. It should be understood that the radius of curvature r is a positive radius of curvature for a surface which is convex towards the wafer side, and is a negative radius of curvature for a surface which is concave towards the wafer side.

TABLE 1

(Main data)

λ = 248.40 nm
β = 1/5
Ym = 11.6 mm
NA = 0.89
D = 0.5 mm (Optical member data)

TABLE 1-continued

| surface number | r | d | n | |
|---|---|---|---|---|
| | (wafer surface) | | | |
| 1 | ∞ | 0.500000 | 1.38000 | (immersion liquid: water) |
| 2 | −278.38803 | 81.380761 | 1.50839 | (lens L43) |
| 3 | −144.83885 | 1.000000 | | |
| 4 | −184.30485 | 18.915187 | 1.50839 | (lens L42) |
| 5 | −704.03874 | 4.822898 | | |
| 6 | −487.23542 | 38.288622 | 1.50839 | (lens L41) |
| 7 | −163.51870 | 1.068326 | | |
| 8 | −316.44413 | 39.899826 | 1.50839 | (lens L38) |
| 9 | −173.82425 | 1.166541 | | |
| 10 | −514.79368 | 38.713118 | 1.50839 | (lens L37) |
| 11 | −256.84706 | 2.993584 | | |
| 12 | −1486.19304 | 39.000000 | 1.50839 | (lens L36) |
| 13 | −349.92079 | 5.231160 | | |
| 14 | 684.32388 | 30.000000 | 1.50839 | (lens L35) |
| 15 | 535.80500 | 16.111594 | | |
| 16 | 1423.09713 | 49.000000 | 1.50839 | (lens L34) |
| 17 | −417.61955 | 1.000000 | | |
| 18 | 534.19578 | 48.373958 | 1.50839 | (lens L33) |
| 19* | −1079.65640 | 3.793818 | | |
| 20 | 363.41400 | 41.353623 | 1.50839 | (lens L32) |
| 21 | 11327.06579 | 1.000000 | | |
| 22 | 221.09486 | 38.438778 | 1.50839 | (lens L31) |
| 23 | 576.34104 | 13.483698 | | |
| 24* | 72641.42689 | 14.000000 | 1.50839 | (lens L24) |
| 25 | 169.78783 | 36.502361 | | |
| 26 | −721.39710 | 14.000000 | 1.50839 | (lens L23) |
| 27* | 163.09868 | 55.546840 | | |
| 28* | −154.09821 | 14.000000 | 1.50839 | (lens L22) |
| 29* | 4602.19163 | 36.940676 | | |
| 30* | −162.70945 | 24.726155 | 1.50839 | (lens L21) |
| 31 | −277.47625 | 9.365299 | | |
| 32 | −233.72917 | 35.657146 | 1.50839 | (lens L115) |
| 33 | −199.92054 | 3.651342 | | |
| 34 | −760.94438 | 50.681020 | 1.50839 | (lens L114) |
| 35 | −267.98451 | 1.000000 | | |
| 36 | −8019.33680 | 51.000000 | 1.50839 | (lens L113) |
| 37 | −361.32067 | 1.000000 | | |
| 38 | 359.57299 | 51.000000 | 1.50839 | (lens L112) |
| 39 | 22205.61483 | 1.000000 | | |
| 40 | 254.06189 | 53.118722 | 1.50839 | (lens L111) |
| 41 | 814.49441 | 2.310847 | | |
| 42 | 207.87392 | 41.299164 | 1.50839 | (lens L110) |
| 43* | 325.56504 | 2.944573 | | |
| 44 | 227.90224 | 30.090705 | 1.50839 | (lens L19) |
| 45 | 176.14016 | 30.818682 | | |
| 46 | −1560.80134 | 14.019437 | 1.50839 | (lens L18) |
| 47* | 211.19874 | 18.615775 | | |
| 48 | −419.25972 | 14.000000 | 1.50839 | (lens L17) |
| 49 | 162.14317 | 19.137169 | | |
| 50 | −385.99461 | 14.000000 | 1.50839 | (lens L16) |
| 51 | 377.23568 | 16.483492 | | |
| 52 | −192.32222 | 14.000000 | 1.50839 | (lens L15) |
| 53 | 577.40909 | 1.000000 | | |
| 54 | 347.51785 | 23.387796 | 1.50839 | (lens L14) |
| 55 | −746.67387 | 1.000000 | | |
| 56 | 230.21868 | 28.789242 | 1.50839 | (lens L13) |
| 57 | −632.24530 | 1.987632 | | |
| 58 | 366.04498 | 19.840462 | 1.50839 | (lens L12) |
| 59 | 658.39254 | 1.000136 | | |
| 60 | 436.06541 | 17.664657 | 1.50839 | (lens L11) |
| 61 | 1827.22708 | 2.355320 | | |
| 62 | ∞ | 8.000000 | 1.50839 | (parallel plane plate P1) |
| 63 | ∞ | 31.664788 | | |
| | (mask surface) | | | |

(aspherical data)
surface 19

$k = 0.000000$
$C_4 = 0.108661 \times 10^{-11}$    $C_6 = 0.115990 \times 10^{-13}$
$C_8 = -0.252101 \times 10^{-18}$    $C_{10} = 0.326093 \times 10^{-22}$
$C_{12} = -0.249918 \times 10^{-26}$    $C_{14} = 0.826218 \times 10^{-31}$
$C_{16} = -0.105890 \times 10^{-35}$    $C_{18} = 0.000000$
surface 24

$k = 0.000000$
$C_4 = -0.666892 \times 10^{-8}$    $C_6 = -0.834628 \times 10^{-13}$
$C_8 = 0.905999 \times 10^{-17}$    $C_{10} = -0.275733 \times 10^{-21}$
$C_{12} = -0.577535 \times 10^{-25}$    $C_{14} = 0.700442 \times 10^{-29}$
$C_{16} = -0.229827 \times 10^{-33}$    $C_{18} = 0.000000$
surface 27

$k = 0.000000$
$C_4 = 0.741662 \times 10^{-9}$    $C_6 = -0.603176 \times 10^{-12}$
$C_8 = -0.996260 \times 10^{-17}$    $C_{10} = 0.500372 \times 10^{-20}$
$C_{12} = -0.274589 \times 10^{-23}$    $C_{14} = 0.173610 \times 10^{-27}$
$C_{16} = 0.556996 \times 10^{-32}$    $C_{18} = 0.000000$
surface 28

$k = 0.000000$
$C_4 = 0.398482 \times 10^{-8}$    $C_6 = 0.375195 \times 10^{-12}$
$C_8 = -0.609480 \times 10^{-16}$    $C_{10} = -0.178686 \times 10^{-19}$
$C_{12} = -0.112080 \times 10^{-24}$    $C_{14} = -0.141732 \times 10^{-27}$
$C_{16} = 0.314821 \times 10^{-31}$    $C_{18} = 0.000000$
surface 29

$k = 0.000000$
$C_4 = -0.891861 \times 10^{-8}$    $C_6 = 0.359788 \times 10^{-12}$
$C_8 = -0.218558 \times 10^{-16}$    $C_{10} = -0.633586 \times 10^{-20}$
$C_{12} = -0.317617 \times 10^{-24}$    $C_{14} = 0.914859 \times 10^{-28}$
$C_{16} = -0.392754 \times 10^{-32}$    $C_{18} = 0.000000$
surface 30

$k = 0.000000$
$C_4 = 0.217828 \times 10^{-8}$    $C_6 = 0.199483 \times 10^{-12}$
$C_8 = 0.346439 \times 10^{-16}$    $C_{10} = 0.816535 \times 10^{-21}$
$C_{12} = 0.143334 \times 10^{-24}$    $C_{14} = -0.229911 \times 10^{-28}$
$C_{16} = -0.164178 \times 10^{-32}$    $C_{18} = 0.000000$
surface 43

$k = 0.000000$
$C_4 = 0.826617 \times 10^{-9}$    $C_6 = -0.152893 \times 10^{-12}$
$C_8 = -0.105637 \times 10^{-17}$    $C_{10} = -0.904672 \times 10^{-23}$
$C_{12} = -0.326047 \times 10^{-25}$    $C_{14} = -0.178192 \times 10^{-30}$
$C_{16} = 0.656718 \times 10^{-34}$    $C_{18} = 0.000000$
surface 47

$k = 0.000000$
$C_4 = -0.374153 \times 10^{-7}$    $C_6 = 0.139807 \times 10^{-11}$
$C_8 = -0.602273 \times 10^{-16}$    $C_{10} = -0.289281 \times 10^{-19}$
$C_{12} = 0.109996 \times 10^{-22}$    $C_{14} = -0.966189 \times 10^{-27}$
$C_{16} = 0.000000$    $C_{18} = 0.000000$
(values in the conditions)

T = 138.58 mm
L = 1323.13 mm
F2 = −68.34 mm
(1) D = 0.5
(2) D/T = 0.003608
(3) T/L = 0.1047
(4) L = 1323.13
(5) |F2|/L = 0.05165

Figure 3:
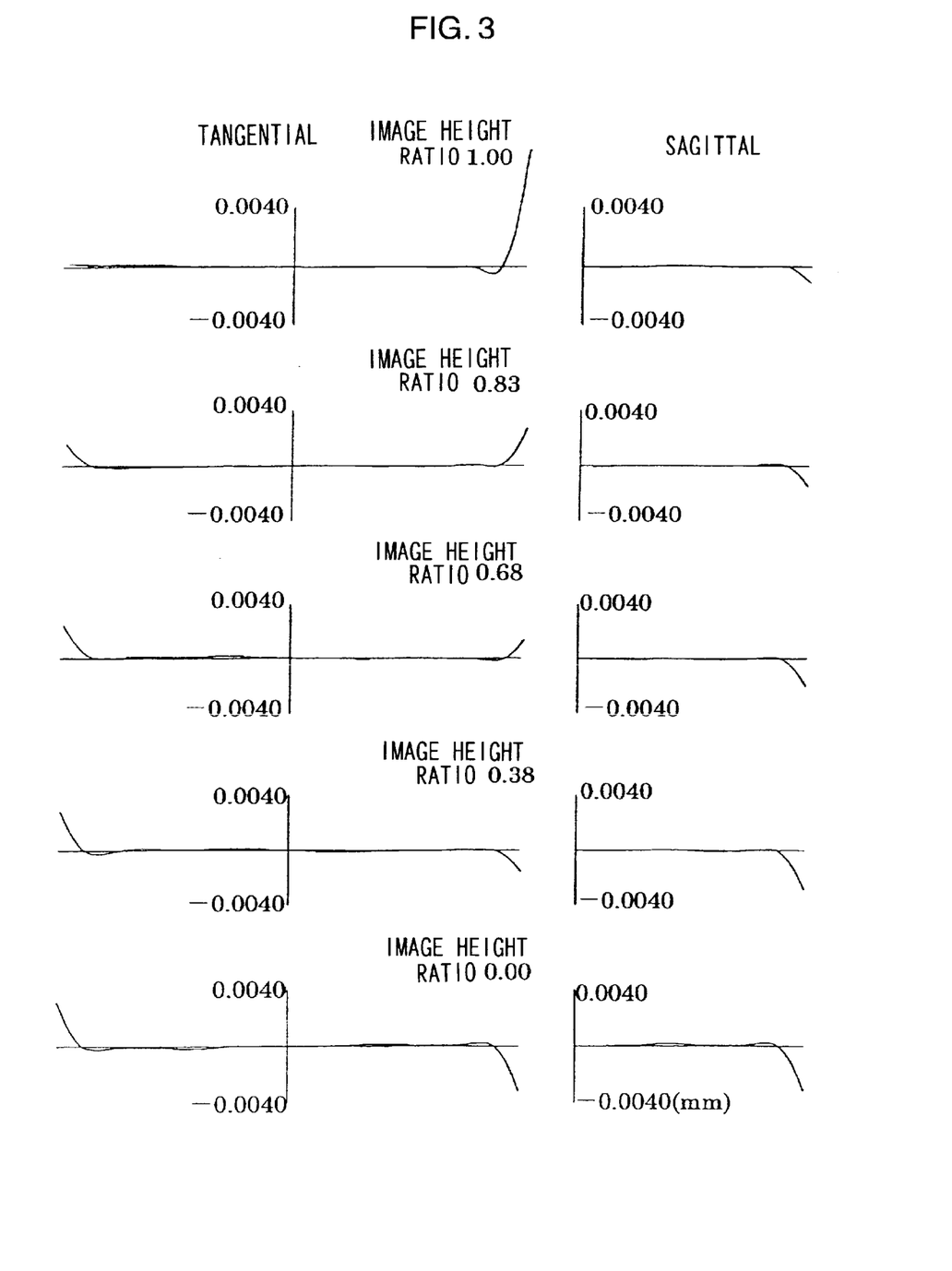
FIG. 3 is a figure showing the coma aberration of this projection optical system according to the first preferred embodiment of the present invention.

FIG. 3 is a figure showing the coma aberration of this projection optical system according to the first preferred embodiment of the present invention. The aberration is given by the scale on the reticle side. As will be clear from this aberration figure, in this first preferred embodiment, even though the image side numerical aperture has been implemented as 0.89 which is extremely high, nevertheless it will be understood that the aberration is properly corrected.

EMBODIMENT TWO

Figure 4:
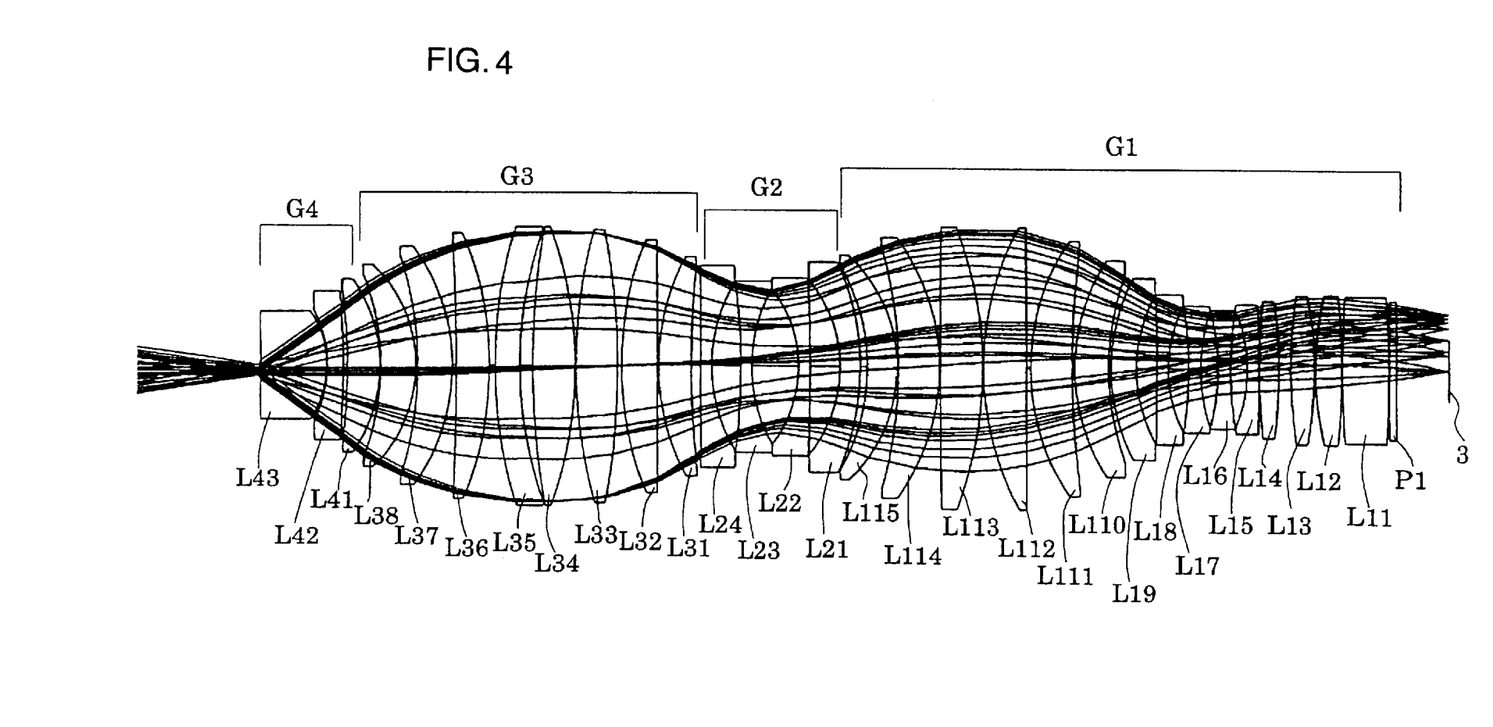
FIG. 4 is a figure showing the structure of lenses of a projection optical system according to a second preferred embodiment of the present invention.

FIG. 4 is a figure showing the structure of lenses of a projection optical system according to the second preferred embodiment of the present invention. In the lenses of FIG. 4, a first lens group G1 comprises, in order from the mask side: a parallel plane plate P1; a biconvex lens L11; another biconvex lens L12; yet another biconvex lens L13; still yet another biconvex lens L14; a negative meniscus lens L15 which presents its convex surface to the mask side; a biconvex lens L16; another biconvex lens L17; yet another biconvex lens L18; a negative meniscus lens L19 which presents its concave surface to the mask side; a positive meniscus lens L110 which presents its concave surface to the mask side; another positive meniscus lens L111 which presents its concave surface to the mask side; a biconvex lens L112; another biconvex lens L113; a positive meniscus lens L114 which presents its convex surface to the mask side; and another positive meniscus lens L115 which presents its convex surface to the mask side.

Furthermore, a second lens group G2 comprises, in order from the mask side: a negative meniscus lens L21 which presents its convex surface to the mask side; a negative meniscus lens L22 which whose concave surface on the wafer side is formed in an aspherical shape; a biconvex lens L23 whose surface on the mask side is formed in an aspherical shape; and a negative meniscus lens L24 whose convex surface on the wafer side is formed in an aspherical shape.

Yet further, a third lens group G3 comprises, in order from the mask side: a positive meniscus lens L31 which presents its concave surface to the mask side; a biconvex lens L32; another biconvex lens L33; yet another biconvex lens L34; a negative meniscus lens L35 whose concave surface on the mask side is formed in an aspherical shape; a positive meniscus lens L36 which presents its convex surface to the mask side; another positive meniscus lens L37 which presents its convex surface to the mask side; and yet another positive meniscus lens L38 which presents its convex surface to the mask side.

Finally, a fourth lens group G4 comprises, in order from the mask side: a positive meniscus lens L41 which presents its convex surface to the mask side; a negative meniscus lens L42 which presents its convex surface to the mask side; and a positive meniscus lens L43 which presents its convex surface to the mask side. In this second preferred embodiment of the present invention, the supply section 10 is made so as to supply air, so that a flow of air is generated in the narrow optical path between the projection optical system 6 and the wafer 7. It should be understood that, since the refractive index of air is 1.0, it is omitted from Table 1 and Table 2.

In the following Table 2, the various data or parameters of the projection optical system according to this second preferred embodiment of the present invention are detailed. In the main data of Table 2, $\lambda$ is the central wavelength of the exposure light, $\beta$ is the projection magnification, Ym is the maximum image height, NA is the image side numerical aperture, and D is the working distance. Furthermore, Table 2 shows all the optical members, and in this table: the surface number in the first column is the sequential order of the surface from the wafer side; r in the second column is the radius of curvature of each surface in mm (in the case of an aspherical surface, this is the radius of curvature of the summit); d in the third column is the gap in mm along the optical axis between the surfaces, in other words the interval between the surfaces; and n in the fourth column is the index of refraction at the central wavelength $\lambda$. It should be understood that the radius of curvature r is a positive radius of curvature for a surface which is convex towards the wafer side, and is a negative radius of curvature for a surface which is concave towards the wafer side.

TABLE 2

(Main data)

$\lambda$ = 248.40 nm
$\beta$ = 1/5
Ym = 11.6 mm
NA = 0.88
D = 2.5 mm (Optical member data)

| Surface number | r | d | n | |
|---|---|---|---|---|
| (wafer surface) | | | | |
| 1 | ∞ | 2.500000 | | |
| 2 | −1270.40584 | 77.251684 | 1.50839 | (lens L43) |
| 3 | −110.72777 | 1.000000 | | |
| 4 | −132.78132 | 18.339030 | 1.50839 | (lens L42) |
| 5 | −1152.71012 | 4.938823 | | |
| 6 | −723.27523 | 38.179053 | 1.50839 | (lens L41) |
| 7 | −181.43794 | 1.050956 | | |
| 8 | −297.93827 | 41.055103 | 1.50839 | (lens L38) |
| 9 | −166.87288 | 2.382931 | | |
| 10 | −427.65954 | 40.104060 | 1.50839 | (lens L37) |
| 11 | −244.29595 | 4.903887 | | |
| 12 | −3387.32378 | 39.000000 | 1.50839 | (lens L36) |
| 13 | −420.50275 | 7.614732 | | |
| 14 | 540.89354 | 29.000000 | 1.50839 | (lens L35) |
| 15* | 474.45854 | 15.158591 | | |
| 16 | 897.00143 | 50.000000 | 1.50839 | (lens L34) |
| 17 | −506.01529 | 1.138429 | | |
| 18 | 570.25291 | 48.910744 | 1.50839 | (lens L33) |
| 19 | −952.62514 | 5.055203 | | |
| 20 | 378.82882 | 43.067991 | 1.50839 | (lens L32) |
| 21 | −78415.53819 | 1.000000 | | |
| 22 | 258.78592 | 40.107177 | 1.50839 | (lens L31) |
| 23 | 1095.44138 | 10.651612 | | |
| 24* | 4500.00000 | 14.000000 | 1.50839 | (lens L24) |
| 25 | 189.07807 | 34.499414 | | |
| 26 | −808.48380 | 14.000000 | 1.50839 | (lens L23) |
| 27* | 177.87730 | 56.721169 | | |
| 28* | −143.78515 | 14.000000 | 1.50839 | (lens L22) |
| 29 | −2706.72147 | 35.781478 | | |
| 30 | −159.97919 | 24.199673 | 1.50839 | (lens L21) |
| 31 | −298.84455 | 8.626663 | | |
| 32 | −239.84826 | 35.242789 | 1.50839 | (lens L115) |
| 33 | −180.77301 | 1.706975 | | |
| 34 | −521.24921 | 49.373247 | 1.50839 | (lens L114) |
| 35 | −258.27460 | 1.000000 | | |
| 36 | 8792.77756 | 51.000000 | 1.50839 | (lens L113) |
| 37 | −481.86914 | 1.000000 | | |
| 38 | 336.67038 | 51.000000 | 1.50839 | (lens L112) |
| 39 | 1368401.4891 | 5.064530 | | |
| 40 | 261.20998 | 49.550014 | 1.50839 | (lens L111) |
| 41 | 1066.67182 | 2.872022 | | |
| 42 | 222.75670 | 41.276937 | 1.50839 | (lens L110) |
| 43 | 309.81127 | 2.988277 | | |
| 44 | 224.97144 | 30.049724 | 1.50839 | (lens L19) |
| 45 | 178.92869 | 24.175760 | | |
| 46 | −4551.95559 | 14.140578 | 1.50839 | (lens L18) |
| 47 | 163.47384 | 23.589033 | | |
| 48 | −435.59405 | 14.000000 | 1.50839 | (lens L17) |
| 49 | 212.20765 | 20.350602 | | |
| 50 | −255.41661 | 14.000000 | 1.50839 | (lens L16) |
| 51 | 476.81062 | 19.854085 | | |
| 52 | −166.35775 | 14.000000 | 1.50839 | (lens L15) |
| 53 | −3092.07241 | 1.000000 | | |
| 54 | 1013.37837 | 21.280878 | 1.50839 | (lens L14) |
| 55 | −649.18244 | 14.095688 | | |
| 56 | 562.23230 | 28.026479 | 1.50839 | (lens L13) |
| 57 | −495.38628 | 1.000000 | | |
| 58 | 400.84453 | 30.179322 | 1.50839 | (lens L12) |
| 59 | −861.42926 | 1.000000 | | |
| 60 | 1152.72543 | 51.631197 | 1.50839 | (lens L11) |
| 61 | −1403.48221 | 1.000057 | | |
| 62 | ∞ | 8.000000 | 1.50839 | (parallel plane plate P1) |
| 63 | ∞ | 59.860116 | | |
| (mask surface) | | | | |

TABLE 2-continued (aspherical data)
surface 15 k = 0.135621
$C_4 = 0.132068 \times 10^{-9}$      $C_6 = 0.254077 \times 10^{-14}$
$C_8 = 0.520547 \times 10^{-18}$     $C_{10} = -0.100941 \times 10^{-22}$
$C_{12} = 0.104925 \times 10^{-27}$  $C_{14} = 0.102740 \times 10^{-31}$
$C_{16} = -0.510544 \times 10^{-36}$  $C_{18} = 0.909690 \times 10^{-41}$
surface 24 k = 0.000000
$C_4 = -0.757298 \times 10^{-8}$     $C_6 = -0.194318 \times 10^{-12}$
$C_8 = 0.114312 \times 10^{-16}$     $C_{10} = 0.325024 \times 10^{-21}$
$C_{12} = -0.811964 \times 10^{-25}$ $C_{14} = 0.733478 \times 10^{-29}$
$C_{16} = -0.344978 \times 10^{-33}$ $C_{18} = 0.593551 \times 10^{-38}$
surface 27 k = 0.000000
$C_4 = 0.274792 \times 10^{-8}$      $C_6 = -0.591295 \times 10^{-12}$
$C_8 = -0.101460 \times 10^{-16}$    $C_{10} = 0.649406 \times 10^{-20}$
$C_{12} = -0.146673 \times 10^{-23}$ $C_{14} = 0.199948 \times 10^{-27}$
$C_{16} = -0.110641 \times 10^{-31}$ $C_{18} = 0.153140 \times 10^{-36}$
surface 28 k = 0.000000
$C_4 = 0.181334 \times 10^{-8}$      $C_6 = 0.386127 \times 10^{-12}$
$C_8 = 0.250729 \times 10^{-16}$     $C_{10} = -0.340803 \times 10^{-20}$
$C_{12} = 0.956332 \times 10^{-24}$  $C_{14} = -0.123696 \times 10^{-27}$
$C_{16} = 0.102868 \times 10^{-31}$  $C_{18} = -0.312692 \times 10^{-36}$
(values in the conditions)

T = 133.77 mm
L = 1407.55 mm
F2 = −72.10 mm
(1) D = 2.5
(2) D/T = 0.01869
(3) T/L = 0.09504
(4) L = 1407.55
(5) |F2|/L = 0.05122

Figure 5:
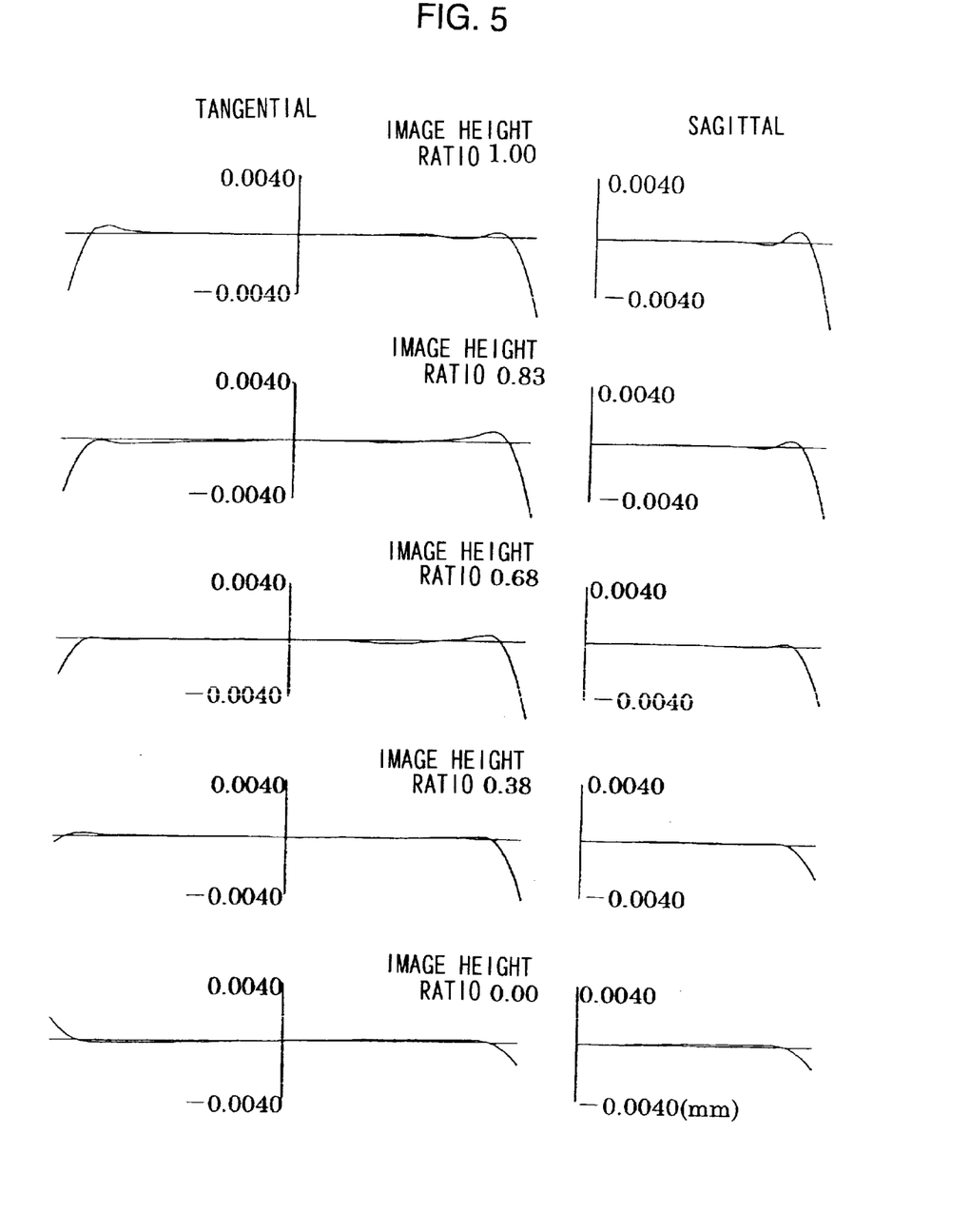
FIG. 5 is a figure showing the coma aberration of this projection optical system according to the second preferred embodiment of the present invention.

FIG. 5 is a figure showing the coma aberration of this projection optical system according to the second preferred embodiment of the present invention. The aberration is given by the scale on the reticle side. As will be clear from this aberration figure, in this second preferred embodiment, even though the image side numerical aperture has been implemented as 0.88 which is extremely high, nevertheless it will be understood that the aberration is properly corrected.

EMBODIMENT THREE

Figure 6:
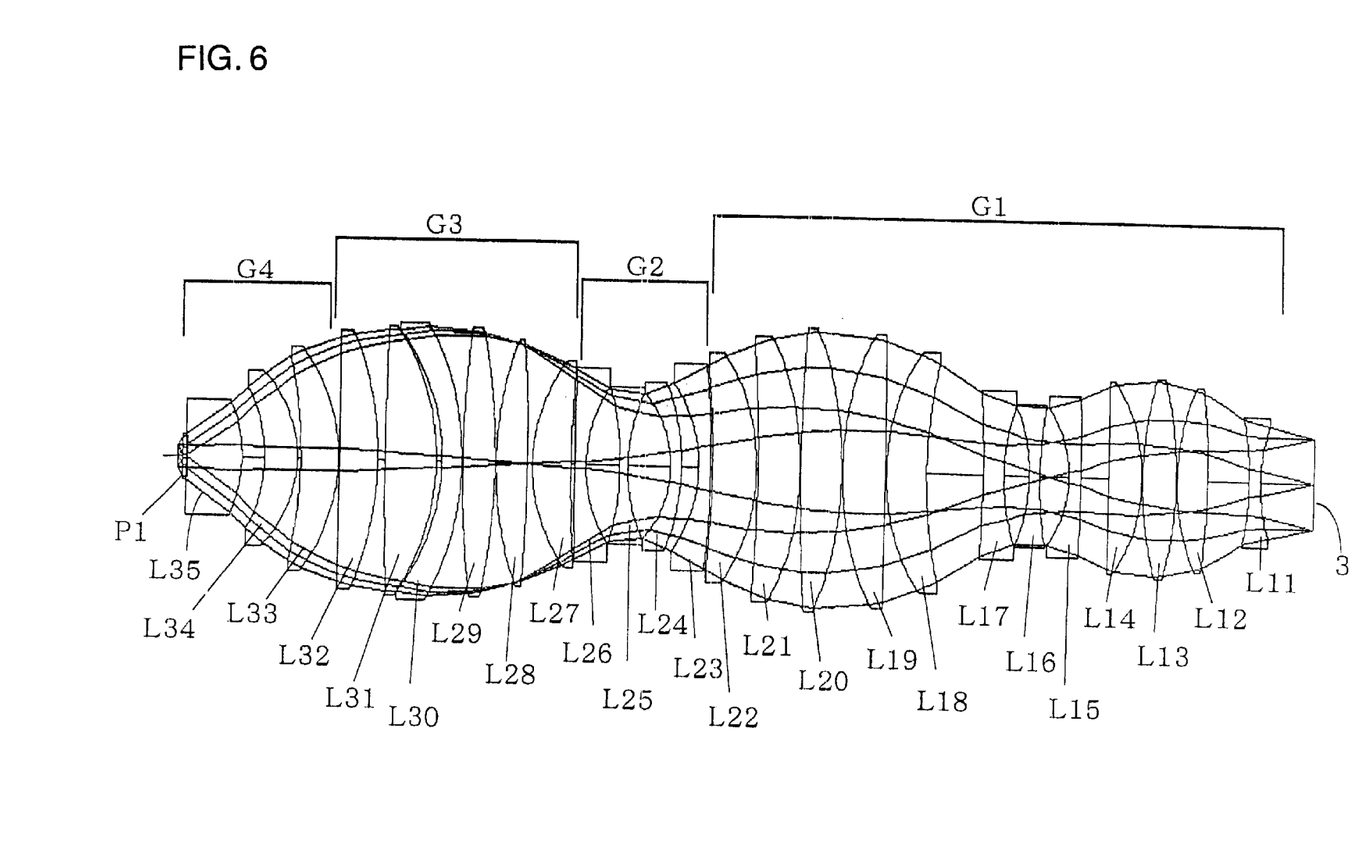
FIG. 6 is a figure showing the structure of lenses of a projection optical system according to a third preferred embodiment of the present invention.

FIG. 6 is a figure showing the structure of lenses of a projection optical system according to the third preferred embodiment of the present invention. In the lens of FIG. 6, a first lens group G1 comprises, in order from the mask side: a biconcave lens L11; a biconvex lens L12; another biconvex lens L13; a positive meniscus lens L14 which presents its convex surface to the mask side; a negative meniscus lens L15 which presents its convex surface to the mask side; a biconcave lens L16; another biconcave lens L17; a positive meniscus lens L18 which presents its concave surface to the mask side; a biconvex lens L19; another biconvex lens L20; a positive meniscus lens L21 which presents its convex surface to the mask side; and another positive meniscus lens L22 which presents its convex surface to the mask side.

Furthermore, a second lens group G2 comprises, in order from the mask side: a negative meniscus lens L23 which presents its convex surface to the mask side; another negative meniscus lens L24 which presents its convex surface to the mask side; a biconcave lens L25; and a negative meniscus lens L26 which presents its concave surface to the mask side.

Yet further, a third lens group G3 comprises, in order from the mask side: a positive meniscus lens L27 which presents its concave surface to the mask side; a biconvex lens L28; another biconvex lens L29; a negative meniscus lens L30 which presents its convex surface to the mask side; a biconvex lens L31; and a positive meniscus lens L32 which presents its convex surface to the mask side.

Finally, a fourth lens group G4 comprises, in order from the mask side: a positive meniscus lens L33 which presents its convex surface to the mask side; another positive meniscus lens L34 which presents its convex surface to the mask side; yet another positive meniscus lens L35 which presents its convex surface to the mask side; and a parallel plane plate P1.

In the following Table 3, the various data or parameters of the projection optical system according to this third preferred embodiment of the present invention are detailed. In the main data of Table 3, λ is the central wavelength of the exposure light, β is the projection magnification, Ym is the maximum image height, NA is the image side numerical aperture, and D is the working distance. Furthermore, Table 3 shows all the optical members, and in this table: the surface number in the first column is the sequential order of the surface from the wafer side; r in the second column is the radius of curvature of each surface in mm (in the case of an aspherical surface, this is the radius of curvature of the summit); d in the third column is the gap in mm along the optical axis between the surfaces, in other words the interval between the surfaces; and n in the fourth column is the index of refraction at the central wavelength λ. It should be understood that the radius of curvature r is a positive radius of curvature for a surface which is convex towards the wafer side, and is a negative radius of curvature for a surface which is concave towards the wafer side.

TABLE 3

(Main data)

λ = 193.31 nm
β = 1/4
Ym = 11.6 mm
NA = 0.85
D = 4.8 mm (Optical member data)

n = 1.560353 (quartz), n = 1.501474 (fluor)

| Surface number | r | d | n | |
|---|---|---|---|---|
| (wafer surface) | | | | |
| 1 | ∞ | 4.800000 | | |
| 2 | ∞ | 4.000000 | 1.501474 | (parallel plane plate P1) |
| 3 | ∞ | 1.516803 | | |
| 4 | −347.07689 | 59.005134 | 1.560353 | (lens L35) |
| 5* | −147.42602 | 24.672134 | | |
| 6 | −155.30862 | 36.048560 | 1.560353 | (lens L34) |
| 7* | −127.29829 | 3.818982 | | |
| 8 | −495.00000 | 41.252390 | 1.560353 | (lens L33) |
| 9 | −186.65984 | 1.837210 | | |
| 10 | −8649.91361 | 41.354410 | 1.560353 | (lens L32) |
| 11 | −338.42422 | 7.812864 | | |
| 12 | 3117.31974 | 56.482714 | 1.501474 | (lens L31) |
| 13 | −242.28533 | 6.259672 | | |
| 14 | −219.07804 | 22.000000 | 1.560353 | (lens L30) |
| 15 | −295.48408 | 1.000000 | | |
| 16 | 982.58745 | 35.100000 | 1.560353 | (lens L29) |
| 17 | −717.19251 | 1.027505 | | |
| 18* | 345.99292 | 35.100000 | 1.501474 | (lens L28) |
| 19 | −1657.34210 | 4.870546 | | |
| 20 | 170.09691 | 43.238577 | 1.501474 | (lens L27) |
| 21* | 1247.60125 | 3.728285 | | |

TABLE 3-continued

| | | | |
|---|---|---|---|
| 22 | 2570.01253 | 12.600000 1.560353 | (lens L26) |
| 23* | 140.20387 | 38.046549 | |
| 24 | −302.07583 | 9.000000 1.560353 | (lens L25) |
| 25 | 174.63448 | 47.228736 | |
| 26* | −110.02031 | 11.990000 1.560353 | (lens L24) |
| 27 | −227.61981 | 19.287967 | |
| 28 | −145.96360 | 13.625000 1.560353 | (lens L23) |
| 29 | −993.54187 | 2.180979 | |
| 30 | −926.50000 | 49.004494 1.501474 | (lens L22) |
| 31 | −211.89314 | 1.805004 | |
| 32 | −1634.25815 | 46.870000 1.560353 | (lens L21) |
| 33 | −309.72040 | 1.090000 | |
| 34 | 1870.87868 | 44.992783 1.560353 | (lens L20) |
| 35 | −397.39272 | 1.090000 | |
| 36 | 310.83083 | 46.730190 1.560353 | (lens L19) |
| 37 | 12381.83318 | 1.065257 | |
| 38 | 219.21300 | 43.890391 1.560353 | (lens L18) |
| 39 | 459.28473 | 62.355122 | |
| 40* | 1607.04793 | 23.010030 1.560353 | (lens L17) |
| 41* | 210.26262 | 27.392360 | |
| 42 | −182.19964 | 11.990000 1.560353 | (lens L16) |
| 43 | 397.04358 | 31.491045 | |
| 44 | −126.09618 | 12.834065 1.560353 | (lens L15) |
| 45 | −4686.72757 | 31.683354 | |
| 46 | −7627.00504 | 35.000000 1.560353 | (lens L14) |
| 47 | −178.80540 | 1.090000 | |
| 48 | 362.15153 | 35.000000 1.560353 | (lens L13) |
| 49 | −434.88773 | 1.000000 | |
| 50 | 217.92403 | 34.335000 1.560353 | (lens L12) |
| 51 | −854.29087 | 44.741881 | |
| 52 | −293.27068 | 11.083963 1.560353 | (lens L11) |
| 53 | 198.96759 | 58.442143 | |
| (mask surface) | | | |

(aspherical data)
surface 5

$k = 0.000000$
$C_4 = -0.717239 \times 10^{-08}$   $C_6 = -0.101122 \times 10^{-11}$
$C_8 = 0.181395 \times 10^{-16}$   $C_{10} = 0.626626 \times 10^{-20}$
$C_{12} = 0.124335 \times 10^{-23}$   $C_{14} = 0.306352 \times 10^{-27}$
$C_{16} = -0.451516 \times 10^{-31}$   $C_{18} = 0.000000$
surface 7

$k = 0.000000$
$C_4 = -0.171015 \times 10^{-09}$   $C_6 = -0.130062 \times 10^{-12}$
$C_8 = -0.919066 \times 10^{-17}$   $C_{10} = -0.567556 \times 10^{-22}$
$C_{12} = 0.169635 \times 10^{-25}$   $C_{14} = 0.232608 \times 10^{-30}$
$C_{16} = 0.300428 \times 10^{-35}$   $C_{18} = 0.285031 \times 10^{-38}$
surface 18

$k = 0.000000$
$C_4 = 0.360694 \times 10^{-09}$   $C_6 = 0.338660 \times 10^{-13}$
$C_8 = 0.880881 \times 10^{-18}$   $C_{10} = -0.289409 \times 10^{-22}$
$C_{12} = -0.909784 \times 10^{-27}$   $C_{14} = 0.759036 \times 10^{-31}$
$C_{16} = -0.400220 \times 10^{-35}$   $C_{18} = 0.235613 \times 10^{-39}$
surface 21

$k = 0.000000$
$C_4 = -0.139770 \times 10^{-08}$   $C_6 = -0.642555 \times 10^{-13}$
$C_8 = 0.410206 \times 10^{-17}$   $C_{10} = 0.559358 \times 10^{-21}$
$C_{12} = -0.314678 \times 10^{-25}$   $C_{14} = -0.577909 \times 10^{-30}$
$C_{16} = 0.154846 \times 10^{-33}$   $C_{18} = -0.130804 \times 10^{-37}$
surface 23

$k = 0.000000$
$C_4 = -0.206235 \times 10^{-08}$   $C_6 = -0.790155 \times 10^{-13}$
$C_8 = -0.830872 \times 10^{-17}$   $C_{10} = -0.678238 \times 10^{-20}$
$C_{12} = -0.145920 \times 10^{-23}$   $C_{14} = -0.234851 \times 10^{-28}$
$C_{16} = 0.259860 \times 10^{-31}$   $C_{18} = -0.223564 \times 10^{-35}$
surface 26

$k = 0.000000$
$C_4 = 0.226273 \times 10^{-08}$   $C_6 = -0.406498 \times 10^{-12}$
$C_8 = -0.357047 \times 10^{-17}$   $C_{10} = -0.897263 \times 10^{-21}$
$C_{12} = -0.510647 \times 10^{-24}$   $C_{14} = -0.322709 \times 10^{-29}$
$C_{16} = 0.480022 \times 10^{-32}$   $C_{18} = -0.529104 \times 10^{-36}$
surface 40

$k = 0.000000$
$C_4 = -0.309170 \times 10^{-08}$   $C_6 = -0.215102 \times 10^{-12}$
$C_8 = -0.403443 \times 10^{-16}$   $C_{10} = 0.485396 \times 10^{-20}$
$C_{12} = 0.676821 \times 10^{-25}$   $C_{14} = -0.456289 \times 10^{-28}$
$C_{16} = 0.323963 \times 10^{-31}$   $C_{18} = -0.337348 \times 10^{-36}$
surface 41

$k = 0.000000$
$C_4 = -0.156117 \times 10^{-07}$   $C_6 = 0.118556 \times 10^{-11}$
$C_8 = -0.440276 \times 10^{-16}$   $C_{10} = -0.123461 \times 10^{-19}$
$C_{12} = 0.933626 \times 10^{-24}$   $C_{14} = 0.134725 \times 10^{-27}$
$C_{16} = -0.261036 \times 10^{-31}$   $C_{18} = 0.000000$
(values in the conditions)

T = 172.15 mm
L = 1246.87 mm
F2 = −49.585 mm
(1) D = 4.8
(2) D/T = 0.02788
(3) T/L = 0.13807
(4) L = 1246.87
(5) |F2|/L = 0.03977

Figure 7:
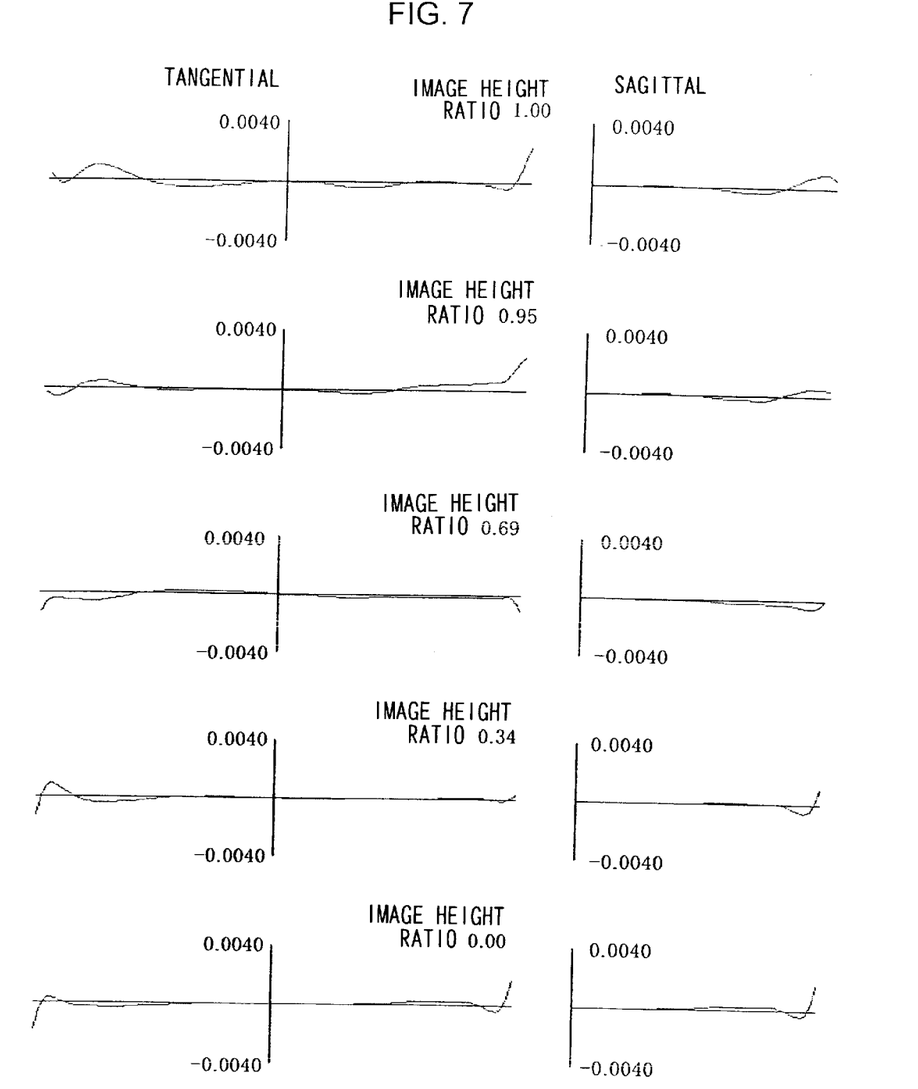
FIG. 7 is a figure showing the coma aberration of this projection optical system according to the third preferred embodiment of the present invention.

FIG. 7 is a figure showing the coma aberration of this projection optical system according to the third preferred embodiment of the present invention. The coma aberration is given by the scale on the reticle side. As will be clear from this aberration figure, in this third preferred embodiment, even though the image side numerical aperture has been implemented as 0.85 which is quite high, nevertheless it will be understood that the aberration is properly corrected.

As described above, with the projection optical systems according to the various preferred embodiments of the present invention explained above, it is possible to keep the image side numerical aperture extremely high, along with restraining increase of the lens outer diameter. Accordingly, with the exposure apparatuses according to the first and second preferred embodiments of the present invention explained above, it is possible to perform projection exposure at high accuracy using a projection optical system of high resolution, based upon the use of KrF excimer laser beams. Furthermore, with the exposure apparatus according to the third preferred embodiment as described above, it is likewise possible to perform projection exposure at high accuracy using a projection optical system of high resolution, based upon the use of ArF excimer laser beams.

With the exposure apparatus according to the present invention as described above, it is possible to manufacture a microdevice (such as a semiconductor element, an image capturing element, a liquid crystal display element, a thin film magnetic head or the like) by illuminating the mask (reticle) via the illumination optical system (a so called illumination process), and by exposing a pattern which is formed upon the mask and which is to be transferred onto a photosensitive substrate via the projection optical system (a so called exposure process). In the following, an example of the procedure utilized when producing a micro device, which in this case is a semiconductor device, by forming a predetermined circuit pattern upon a wafer or the like, which serves as the photosensitive substrate, using the exposure apparatus according to the present invention as described above, will be explained with reference to the flow chart of FIG. 8.

Figure 8:
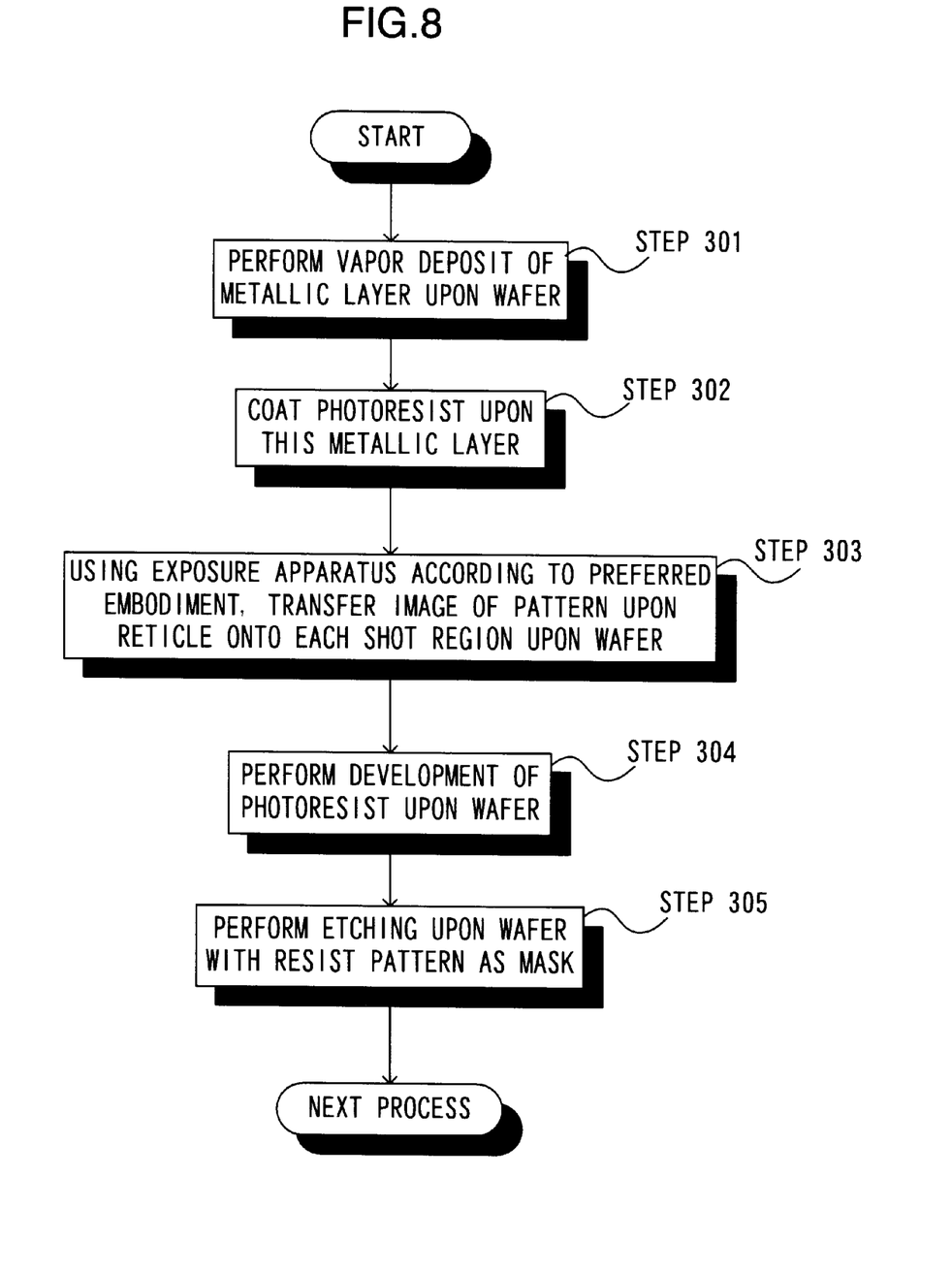
FIG. 8 is a flow chart showing a procedure when manufacturing a semiconductor device which is a microdevice.

First, in a step 301 of FIG. 8, a metallic layer is formed by vapor deposition upon a wafer in one lot Next, in a step 302, a photoresist is coated upon this metallic layer upon the wafer in one lot. After this, in a step 303, an image of a pattern upon a mask is exposed and transferred onto each shot region upon this wafer in one lot in order, using an exposure apparatus according to any of the preferred embodiments of the present invention as described above, via the projection optical system of this exposure apparatus. After this, in a step 304, the photoresist upon this wafer in one lot is developed, and then in a step 305 etching is performed upon the wafer in one lot with this resist pattern as a mask, so that a circuit pattern is formed upon each shot region of the wafer corresponding to the pattern upon the mask. After this, devices such as semiconductor elements or the like are manufactured by forming circuit patterns on further upper layers or the like. According to the above described method of semiconductor device manufacture, it is possible to obtain semiconductor devices having an extremely minute circuit pattern with good throughput.

Furthermore it is possible, by utilizing the exposure apparatus according to the present invention as described above, to obtain a microdevice, which in this case is a liquid crystal display element, by forming predetermined patterns (a circuit pattern, an electrode pattern, and the like) upon a plate (a glass substrate). In the following, an example of the procedure utilized in this case will be explained with reference to the flow chart of FIG. 9. Referring to this figure, first in a pattern formation process 401 a so called photolithography process is performed by exposing and transferring an image of a pattern upon a mask onto a photosensitive substrate (a glass substrate or the like which is coated with a resist), using an exposure apparatus according to any of the preferred embodiments of the present invention as described above, via the projection optical system of this exposure apparatus. A predetermined pattern including a large number of electrodes or the like is formed upon the photosensitive substrate by this photolithography process. After this, various processes such as a development process, an etching process, a resist removing process and the like are performed upon this substrate which has been exposed, so that the predetermined pattern is formed upon the substrate, and next a color filter formation process 402 is started.

Figure 9:
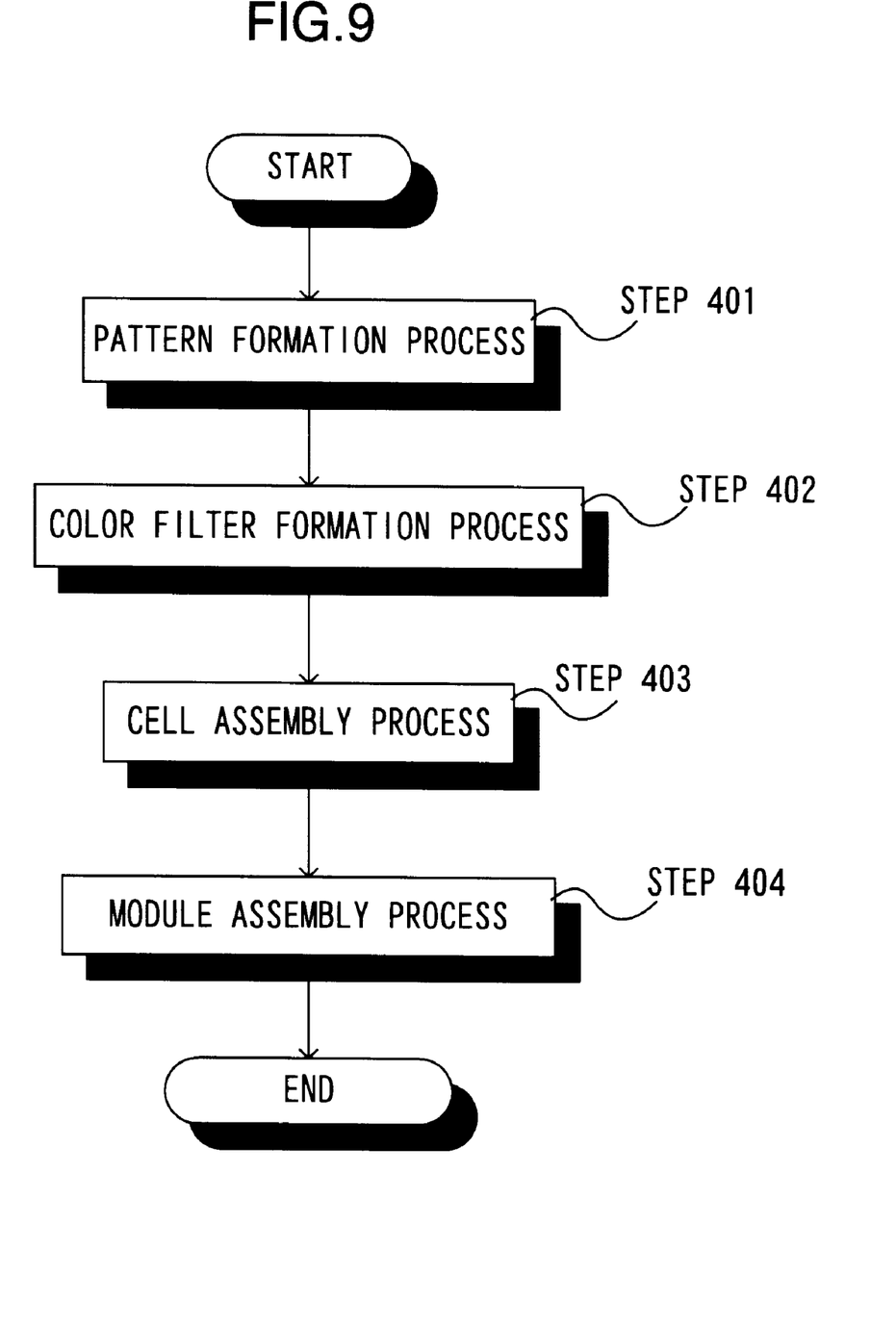
FIG. 9 is a flow chart showing a procedure when manufacturing a liquid crystal display element which is a microdevice.

In this color filter formation process 402, a color filter is formed in which a large number of groups of three dots which correspond to R (red), G (green), and B (blue) are arranged in a matrix pattern, or a plurality of groups of three R, G, and B filter stripes are arranged in the horizontal scan line direction. And after this color filter formation process, a cell assembly process 403 is performed. In this cell assembly process, a liquid crystal panel (liquid crystal cell) is assembled using the substrate having the predetermined pattern which was produced in the pattern formation process 401, and the color filter which was produced in the color filter formation process 402. In this cell assembly process, for example, a quantity of liquid crystal material is introduced between the substrate having the predetermined pattern which was produced in the pattern formation process 401, and the color filter which was produced in the color filter formation process 402, and thereby a liquid crystal panel (a liquid crystal cell) is manufactured.

After this, in a module assembly process 404, various further elements such as an electrical circuit which performs display operation for this liquid crystal panel (liquid crystal cell) which has been thus assembled, a backlight, and the like are fitted thereto, and thereby the manufacture of the liquid crystal display element is completed. It is possible to manufacture liquid crystal display elements having an extremely fine circuit pattern with good throughput, according to the above described method for liquid crystal display element manufacture.

It should be understood that, although the above explanation of various preferred embodiments of the present invention was made in terms of the use of a KrF excimer laser light source as the light source, this is not to be considered as being limitative of the present invention; for example, it would also be possible to utilize an ArF excimer laser light source (of wavelength 193 nm) as the light source; and other suitable possibilities could also be exploited.

Furthermore, although the above explanation of various preferred embodiments of the projection optical system of the present invention was made, by way of example, in terms of the projection optical system being fitted to an exposure apparatus, it will be clearly understood that it is possible to apply the present invention to any projection optical system for forming an image of a first object upon a second object.

What is claimed is:

1. A projection optical system whose image side numerical aperture is greater than or equal to 0.75, and which forms an image of a first object upon a second object using light of a predetermined wavelength less than or equal to 300 nm, comprising:

a first lens group G1 of positive refractive power;

a second lens group G2 of negative refractive power;

a third lens group G3 of positive refractive power; and a fourth lens group G4 of positive refractive power, wherein:

the first lens group G1, the second lens group G2, the third lens group G3 and the fourth lens group G4 are arranged in order from a side of the first object; and a distance D in mm along an optical axis between an optical surface of the fourth lens group G4 closest to the second object, and the second object, satisfies a condition of $0.1<D<5$.

2. A projection optical system according to claim 1, wherein the projection optical system has an image side numerical aperture greater than or equal to 0.8.

3. A projection optical system according to claim 1, wherein, with T being a sum of thicknesses along the optical axis of all optical members included in the fourth lens group G4, and with D being the distance along the optical axis between the optical surface of the fourth lens group G4 closest to the second object, and the second object, a condition of $0.001<D/T<0.2$ is satisfied.

4. A projection optical system according to claim 1, wherein, with T being a sum of the thicknesses along the optical axis of all optical members included in the fourth lens group G4, and with L being a distance along the optical axis between the first object and the second object, a condition of $0.02<T/L$ is satisfied.

5. A projection optical system according to claim 1, wherein a distance L in mm along the optical axis between the first object and the second object satisfies a condition of $800<L<1600$.

6. A projection optical system according to claim 1, wherein a focal length F2 of the second lens group G2 and a distance L in mm along the optical axis between the first object and the second object satisfy a condition of $0.01<|F2|/L<0.15$.

7. A projection optical system according to claim 1, wherein at least one of a plurality of optical surfaces comprised in the projection optical system is formed in an aspherical shape.

8. An exposure apparatus, comprising:

an illumination system for illuminating a mask as a first object;

a projection optical system according to claim 1, that forms an image of a pattern which is formed upon the mask upon a photosensitive substrate as the second object; and a prevention device that prevents gas which is generated from the photosensitive substrate from adhering to the optical surface closest to the second object of the fourth lens group G4 of the projection optical system.

9. An exposure apparatus according to claim 8, wherein the prevention device comprises a flow forming device that forms a predetermined flow of gas or liquid in a optical path between the optical surface closest to the second object of the fourth lens group G4 and the photosensitive substrate.

10. An exposure method, comprising:

an illumination process of illuminating a mask as a first object; and an exposure process of exposing, via a projection optical system according to claim 1, an image of a pattern which is formed upon the mask upon a photosensitive substrate as the second object, wherein the exposure process comprises a flow formation process of forming a predetermined flow of gas or liquid in a optical path between the optical surface closest to the second object of the fourth lens group G4 and the photosensitive substrate, in order to prevent gas which is generated from the photosensitive substrate from adhering to the optical surface closest to the second object of the fourth lens group G4.

11. A method for manufacturing a microdevice, comprising:

an exposure process of exposing a pattern on a mask upon a photosensitive substrate, using an exposure method according to claim 10; and a development process of developing the photosensitive substrate which has been exposed by the exposure process.

* * * * *